United States Patent
Crenshaw et al.

(10) Patent No.: US 6,180,446 B1
(45) Date of Patent: *Jan. 30, 2001

(54) METHOD OF FABRICATING AN OXYGEN-STABLE LAYER/DIFFUSION BARRIER/POLY BOTTOM ELECTRODE STRUCTURE FOR HIGH-K DRAMS USING DISPOSABLE-OXIDE PROCESSING

(75) Inventors: Darius Crenshaw, Allen, TX (US); Scott Summerfelt, Cupertino, CA (US)

(73) Assignee: Texas Instruments Incorporated, Dallas, TX (US)

( * ) Notice: Under 35 U.S.C. 154(b), the term of this patent shall be extended for 0 days.

This patent is subject to a terminal disclaimer.

(21) Appl. No.: 09/211,911

(22) Filed: Dec. 15, 1998

Related U.S. Application Data

(60) Provisional application No. 60/069,939, filed on Dec. 17, 1997.

(51) Int. Cl.[7] ............................................. H01L 21/8242
(52) U.S. Cl. ........................................... 438/240; 438/238
(58) Field of Search ............................... 438/3, 240, 238, 438/239, 250, 381, 394

(56) References Cited

U.S. PATENT DOCUMENTS

| | | | |
|---|---|---|---|
| 5,393,352 | 2/1995 | Summerfelt | 148/33.3 |
| 5,471,364 | 11/1995 | Summerfelt et al. | 361/321.4 |
| 5,554,564 | 9/1996 | Nishioka et al. | 437/192 |
| 5,566,045 | 10/1996 | Summerfelt et al. | 361/231.1 |
| 5,585,300 | 12/1996 | Summerfelt | 437/60 |
| 5,589,284 | 12/1996 | Summerfelt et al. | 428/697 |
| 5,909,624 | * 6/1999 | Yeager et al. | 438/396 |
| 5,972,722 | * 10/1999 | Visokay et al. | 438/3 |
| 5,998,225 | * 10/1999 | Crenshaw et al. | 438/3 |
| 6,033,919 | * 3/2000 | Gnade et al. | 438/3 |

* cited by examiner

*Primary Examiner*—Richard Elms
*Assistant Examiner*—Bradley K Smith
(74) *Attorney, Agent, or Firm*—Jacqueline J. Garner; W. James Brady III; Frederick J. Telecky, Jr.

(57) ABSTRACT

A capacitor structure and method. The capacitor (12) comprises a HDC dielectric (40) and upper (44) and lower electrodes. The lower electrode comprises a capacitor via (19), diffusion barrier (34) and an oxygen stable material (36). The diffusion barrier (34) is formed over the capacitor via (19) and bitline via (17). The bitline structure (20) is then formed. Next, a multi-level dielectric (80,84) is formed and storage node areas (70) are etched through the multi-level dielectric leaving dielectric sidewalls (66) on the bitline structure (20). The oxygen stable material (36) is then formed in the storage node area (70). Portions of the multi-level dielectric layer (84) over the bitline structure (20) are removed. The HDC dielectric (40) is then formed adjacent the oxygen stable material (36).

21 Claims, 10 Drawing Sheets

METHOD OF FABRICATING AN OXYGEN-STABLE LAYER/DIFFUSION BARRIER/POLY BOTTOM ELECTRODE STRUCTURE FOR HIGH-K DRAMS USING DISPOSABLE-OXIDE PROCESSING

CROSS-REFERENCE TO RELATED CO-PENDING APPLICATIONS

This application claims priority under 35 USC § 119 (e)(1) of provisional application number 60/069,939, filed Dec. 17, 1997.

The following co-assigned patent applications are related and are hereby incorporated by reference:

| Serial No. | Filing date | Inventor(s) |
| --- | --- | --- |
| TI-22551 | | Crenshaw et al. |
| TI-25532 | | Crenshaw et al. |
| TI-25533 | | Crenshaw et al. |

FIELD OF THE INVENTION

This invention generally relates to the fabrication of high dielectric constant capacitors.

BACKGROUND OF THE INVENTION

The increasing density of integrated circuits (e.g., DRAMs) is increasing the need for materials with high dielectric constants to be used in electrical devices such as capacitors. Generally, capacitance is directly related to the surface area of the electrode in contact with the capacitor dielectric, but it is not significantly affected by the electrode volume. The current method generally used to achieve higher capacitance per unit area is to increase the surface area/unit area by increasing the topography in trench and stack capacitors using silicon dioxide or silicon dioxide/silicon nitride as the dielectric. This approach becomes very difficult in terms of manufacturability for devices such as the 256 Mbit and 1 Gbit DRAMs.

An alternative approach is to use a high permitivity dielectric material. Many high dielectric constant (HDC) materials including perovskites, ferroelectrics and others, such as $(Ba, Sr)TiO_3$ (BST), usually have much larger capacitance densities than standard $SiO_2$—$Si_3N_4$—$SiO_2$ capacitors. The deposition process for HDC materials such as BST usually occurs at high temperature (generally greater than 500° C.) in an oxygen containing atmosphere. Therefore, the lower electrode structure formed prior to the HDC deposition should be stable in an oxygen atmosphere and at these temperatures.

Various metals and metallic compounds, and typically noble metals such as Pt and conductive oxides such as $RuO_2$, have been proposed as the electrodes for the HDC materials. However, there are several problems with the materials thus far chosen for the lower electrode in thin-film applications. Many of these problems are related to semiconductor process integration. For example, it has been found to be difficult to use Pt alone as the lower electrode. While Pt is stable in oxygen, it generally allows oxygen to diffuse through it allowing neighboring materials to oxidize. Pt does not normally stick very well to traditional dielectrics such as silicon dioxide and silicon nitride and Pt can rapidly form a silicide at low temperatures. Therefore, prior art methods have used lower electrodes comprising multiple layers to separate the Pt from the underlying silicon. However, even when multiple layers are used for the lower electrode, a problem remains in that Pt is very difficult to etch when using a pattern. The principle problem is the difficulty in forming volatile halides. For example, etching Pt in fluorine and chlorine gas mixtures is almost a completely physical process until very high temperatures (>300° C.) are reached. Physical etching typically results in redeposition on the sidewalls of photoresist or other pattern definers unless a very sloped sidewall (<65 degrees) is used. If the goal is to etch 1G-like structures (F-0.18 $\mu$m) with reasonable aspect ratios (>1), then sloped sidewalls are a serious problem.

SUMMARY OF THE INVENTION

A capacitor structure and method of forming the capacitor structure are disclosed herein. The capacitor comprises a HDC dielectric and upper and lower electrodes. The lower electrode comprises an oxygen stable material. A temporary dielectric is formed and storage node areas are etched through the temporary dielectric. The oxygen stable material-is then formed in the storage node area. Portions of the temporary dielectric layer are removed. The HDC dielectric is then formed adjacent the oxygen stable material.

In one embodiment of the invention, a bitline structure is used that has a silicon dioxide sidewall and top cover as well as an etchstop layer covering both the top cover and sidewall. A single pattern may then be used for the storage node and storage node contact etch The oxygen stable material is then used for both the storage node and the storage node contact.

An advantage of the invention is proving a method of forming a high-K capacitor that does not require a fine patterned etch of the oxygen stable material for the lower electrode.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

The invention is described herein in conjunction with a high-K capacitor structure for a DRAM application. It will be apparent to those of ordinary skill in the art that the benefits of the invention are also applicable to other high-K capacitor structures.

Figure 1:
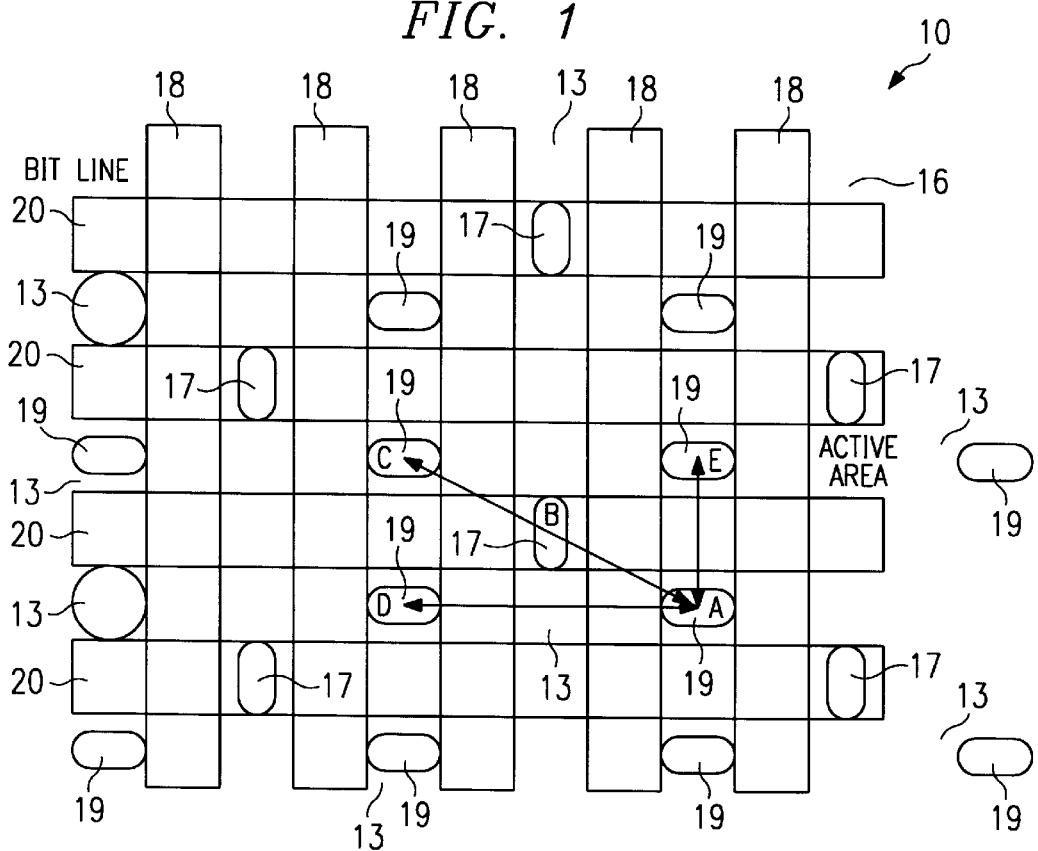
FIG. 1 is a top view of a DRAM array.

FIG. 1 is a top view of a DRAM array 10. DRAM array 10 consists of a plurality of wordlines 18 (shown as running vertically) and a plurality of bitlines 20 (shown as running horizontally). The active areas 13 are isolated from each other by isolation structures 16. Isolation structures 16 are shown in FIG. 1 as the unshaded areas including the unshaded areas running below the bitlines 20 and wordlines 18. Contact/vias 17 and 19 extend down to the active area 13. Contact/vias 17 are bitline contacts that connect the active area to the bitlines 20 and contact/vias 19 are typically polysilicon plugs that connect the active areas 13 to the storage node contact for the capacitor (not shown).

Figure 2:
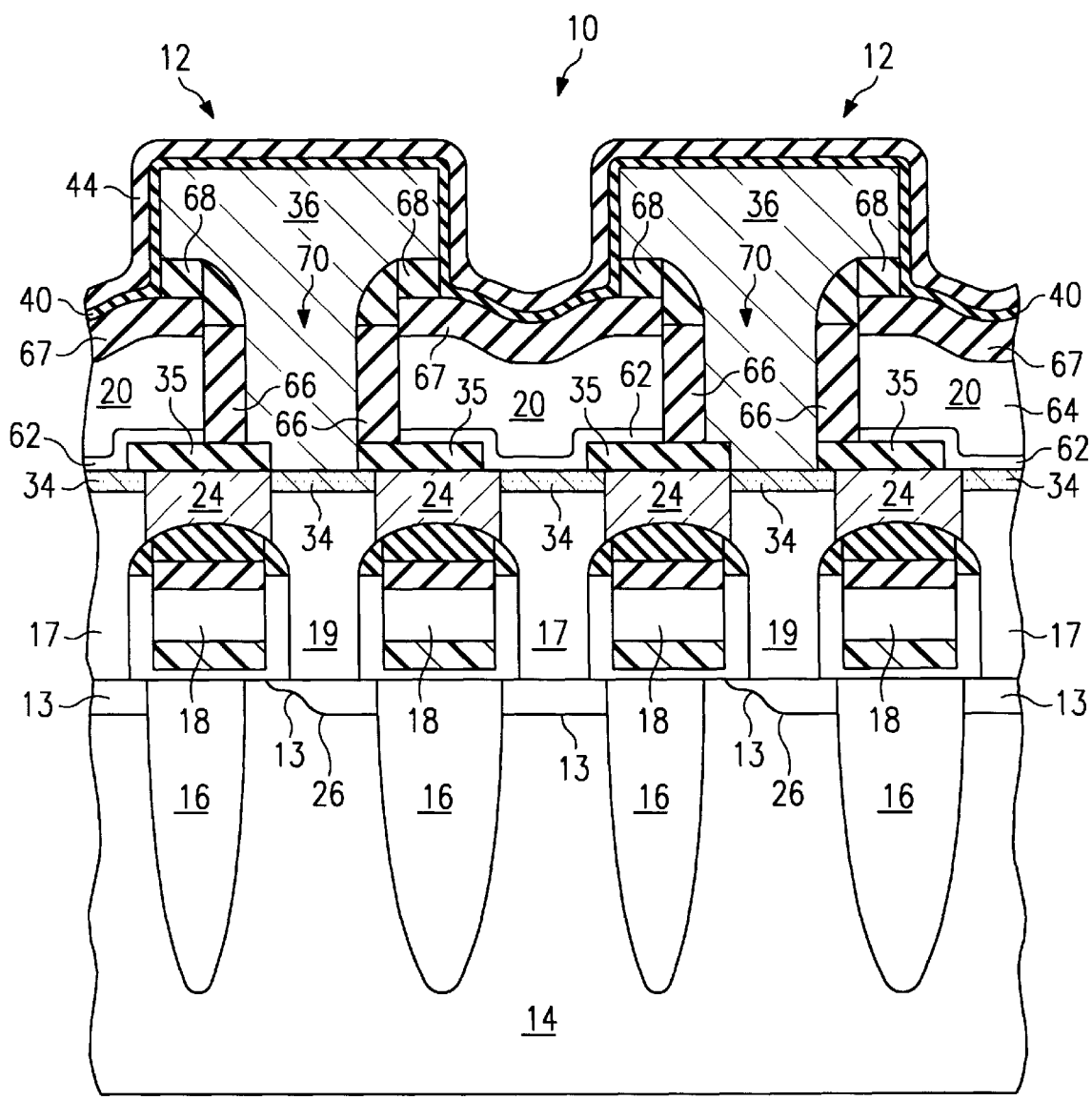
FIG. 2 is a cross-sectional diagram of a DRAM array including a capacitor according to the invention.

A cross-section of DRAM array 10 through a line through A and C of FIG. 1 is shown in FIG. 2. The DRAM array 10 is located on substrate 14. Substrate 14 is typically silicon. However, other semiconductors such as germanium or diamond, compound semiconductors such as GaAs, InP, Si/Ge, or SiC, and ceramics may alternatively be used. Insulating regions 16 are used to isolate pairs of DRAM cells from other DRAM cell pairs. As shown, insulating regions 16 comprise trench isolation. Other isolation structures known in the art, such as LOCOS isolation, may alternatively be used. Wordline structures 18 may the same as those used conventionally in DRAM structures. Bitline vias 17 connect bitlines 20 to the active areas 13. The source/drain regions 26 of active area 13 are each connected to capacitor vias 19. The interlevel dielectric layer 24 typically comprises an oxide such as silicon dioxide.

Bitlines 20 comprise an adhesion layer 62 and metal layer 64. Bitlines 20 are surrounded by a dielectric sidewall 66 and covered by dielectric layer 67. Silicon dioxide is preferable to a silicon nitride to reduce parasitic capacitance for both the sidewall dielectric 66 and dielectric layer 67. Alternatively, low dielectric constant dielectric materials could be used. If sidewalls 66 do not comprise silicon nitride, an etchstop material 68 may be placed above sidewalls 66 and at least portions of dielectric layer 67. Etchstop material 68 may be used as a hardmask (as described further below) in forming capacitor areas 70.

The bottom electrode of capacitors 12 comprises a via 19 that extends from source/drain region 26 through interlevel dielectric layer 24 to diffusion barrier 34. Diffusion barrier 34 is located above and self-aligned to both capacitor vias 19 and bitlines vias 17. Vias 17 and 19 would typically comprise doped polysilicon, such as insitu-doped polysilicon. The thickness of diffusion barrier layer 34 may be on the order of 1000 Å. Above diffusion barrier layer 34 is oxygen stable layer 36. The height of oxygen stable layer 36 is the height desired for the storage node plus the height of the bitline structure 20 (including the overlying dielectric and/or etchstop layers). For a 1 Gbit BST DRAM, a store thickness of approximately 3000 Å is appropriate. Diffusion barrier 34 preferably comprises a nitrided silicide. Oxygen stable layer 36 preferably comprises platinum. Other possible materials include other noble metals or alloys thereof (e.g., palladium, iridium, ruthenium, rhodium, gold, silver), conductive metal compounds (e.g., binary oxides, $RuO_x$, tin oxide, $IrO_x$, indium oxide, etc,), or conductive perovskite like materials (e.g., $(La,Sr)CoO_{3+}$, $SrRuO_3$, etc.).

Diffusion barrier 34 prevents oxygen from diffusing through oxygen stable layer 36 and reacting with/oxidizing capacitor via 19. It also prevents oxygen stable layer 36 from reacting with capacitor via 19. The diffusion barrier might be omitted for some combinations of oxygen stable materials and high-K material process temperature and ambients when oxidation and/or reaction with the via 19 is not a concern.

The capacitor dielectric 40 is a high dielectric constant dielectric, typically having a dielectric constant greater than 50. Barium-strontium titanate (BST) is a typical example. Other examples include $SrTiO_3$, $BaTiO_3$, ferroelectric materials such as $Pb(Zr,Ti)O_3$, $(Pb,La)(Zr,Ti)O_3$, Nb doped PZT, doped PZT, $Bi_4Ti_3O_{12}$, $SrBi_2(Ta,Nb)_2O_9$, and other layered perovskites, relaxors such as lead-magnesium-niobate. Dielectric 40 follows the contour of the device and is located on the upper sidewalls and on the surface of oxygen stable layer 36. The formation of dielectric 40 is typically performed in an $O_2$ ambient. Oxygen stable layer 36 is stable in $O_2$ and since only the oxygen stable layer is exposed during BST formation, oxidation of the bottom electrode is prevented. A top electrode 44 is located over the dielectric 40. The top electrode 44 comprises conventional materials.

Figure 4:
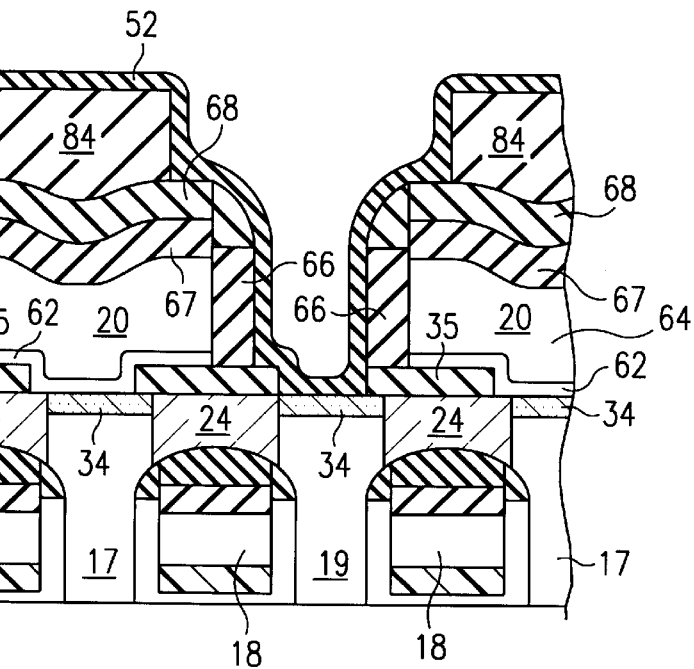
FIG. 4 is a cross-sectional diagram of a DRAM array including a crown-type capacitor according to the invention.
Figure 3A:
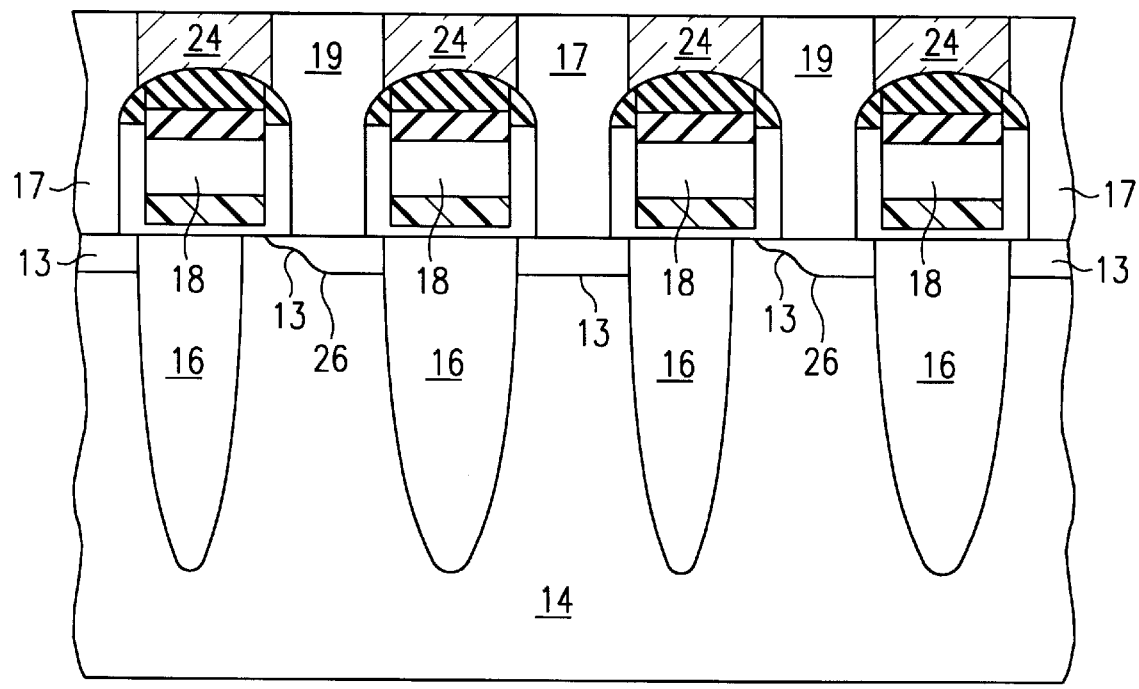
FIGS. 3A–3Q are cross-sectional diagrams of the DRAM array of FIGS. 1 and 2 at various stages of fabrication.

A method for forming the DRAM array 10 of FIGS. 1 and 2 will now be described in conjunction with FIGS. 3A–3Q, and 4. The structure is processed through the formation of interlevel dielectric 24 as shown in FIG. 3A. Isolating regions 16, source/drain regions 26, wordline structures 18, bitline vias 17, capacitor vias 19, and interlevel dielectric 24 have already been formed. Conventional techniques known in the art may be used to formed these structures.

Figure 3B:
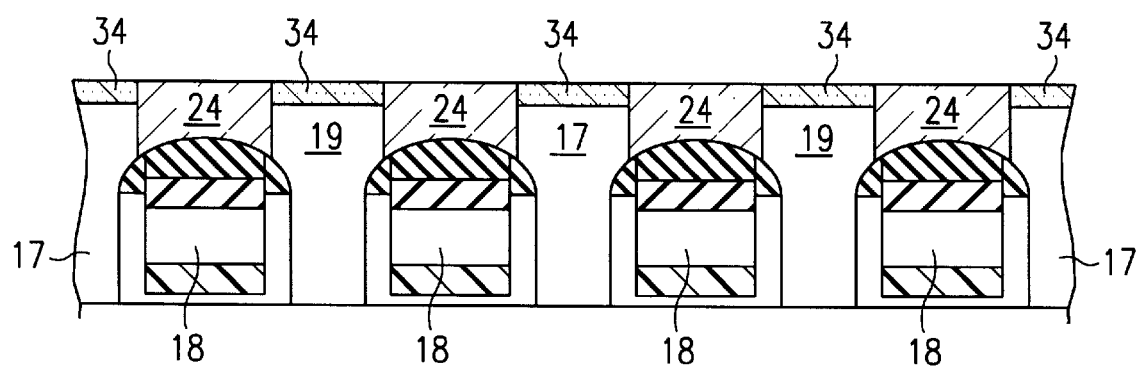

Referring to FIG. 3B, a self-aligned diffusion barrier 34 is formed over bitline vias 17 and capacitor vias 19. The simplest implementation of this process is to use polysilicon for the vias 17 and 19 and form an aligned silicide on the polysilicon. Then, the structure is subjected to an elevated temperature nitrogen plasma with a relatively large substrate bias. This is equivalent to a low energy implantation. This process converts the silicide to a nitride diffusion barrier 34. The rest of the interlevel dielectric layer 24 surface is converted to Si—O—N.

Figure 3C:
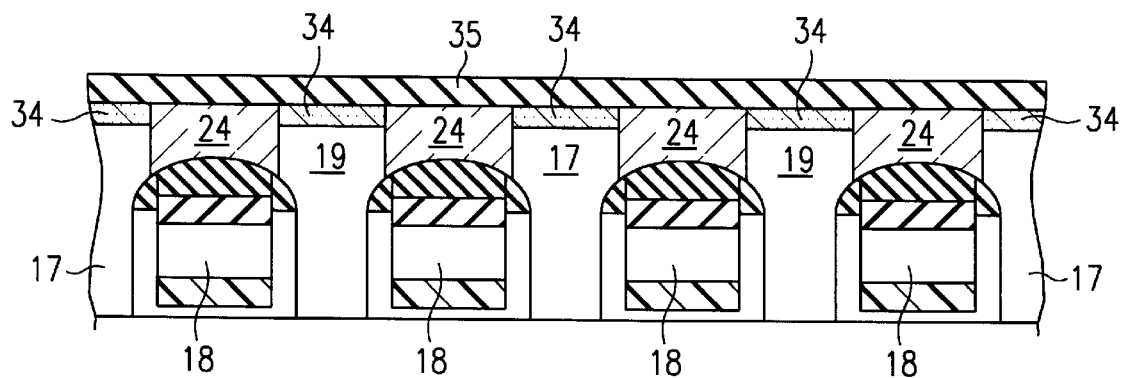
Figure 3D:
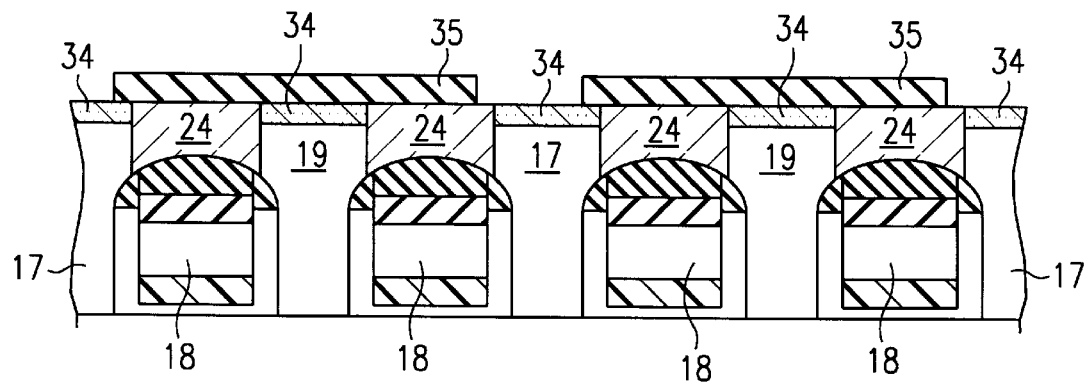

Referring to FIG. 3C, an isolation layer 35 is deposited over the diffusion barrier 34 and interlevel dielectric 24. Preferably, silicon-dioxide is used for isolation layer 35. The purpose of isolation layer 35 is to isolate the capacitor vias 19 from the bitlines vias 17. Isolation layer 35 also serves as an etchstop for the bitline etch and etchback processes described below. Isolation layer 35 is then patterned and etched to expose the bitlines vias 17 as shown in FIG. 3D. Although ideally the patterned etch is perfectly aligned to the bitline vias 17, alignment tolerances are allowed for. Some misalignment is shown in FIG. 3D.

Figure 3E:
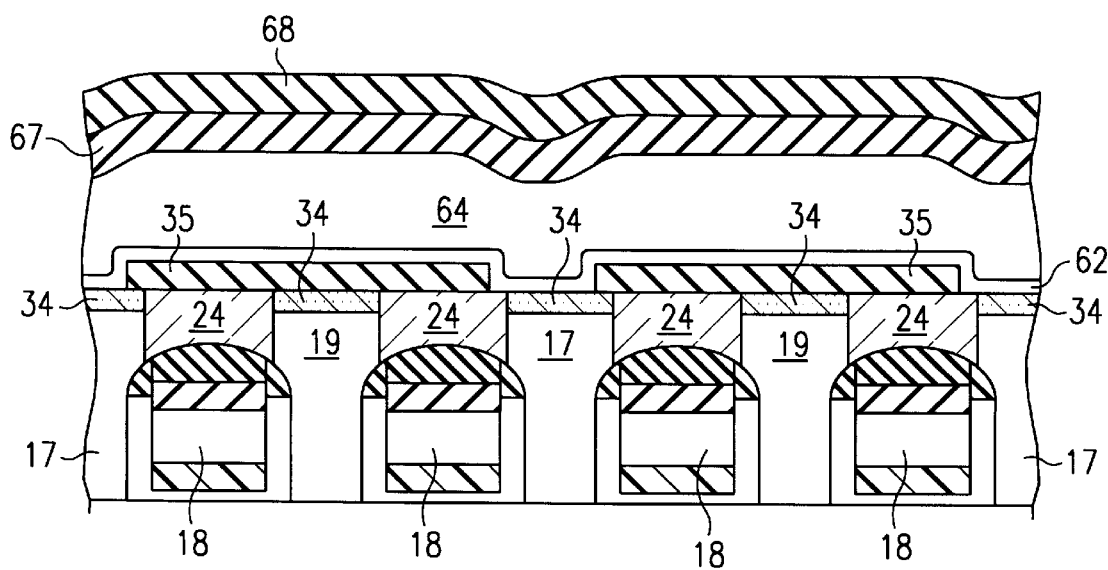

Next, the bitline stack is deposited as shown in FIG. 3E. First, an adhesion layer 62 is deposited followed by the deposition of a metal layer 64, such as W. Although not shown, an adhesion layer may also be formed above metal layer 64. Other conductive structures may alternatively be used. A dielectric layer 67 is formed over metal layer 64. Preferably, silicon dioxide is used for dielectric layer 67 instead of silicon nitride to reduce capacitance between the bitline 20 and the subsequently formed capacitor. By varying the thickness of dielectric layer 67, capacitance can be controlled. Alternatively, low dielectric constant materials can be used for dielectric layer 67. An etchstop layer 68 is formed over dielectric layer 67 if layer 67 does not comprise silicon nitride. Etchstop layer 68 may, for example, comprise silicon nitride, aluminum, or aluminum-oxide.

Figure 3F:
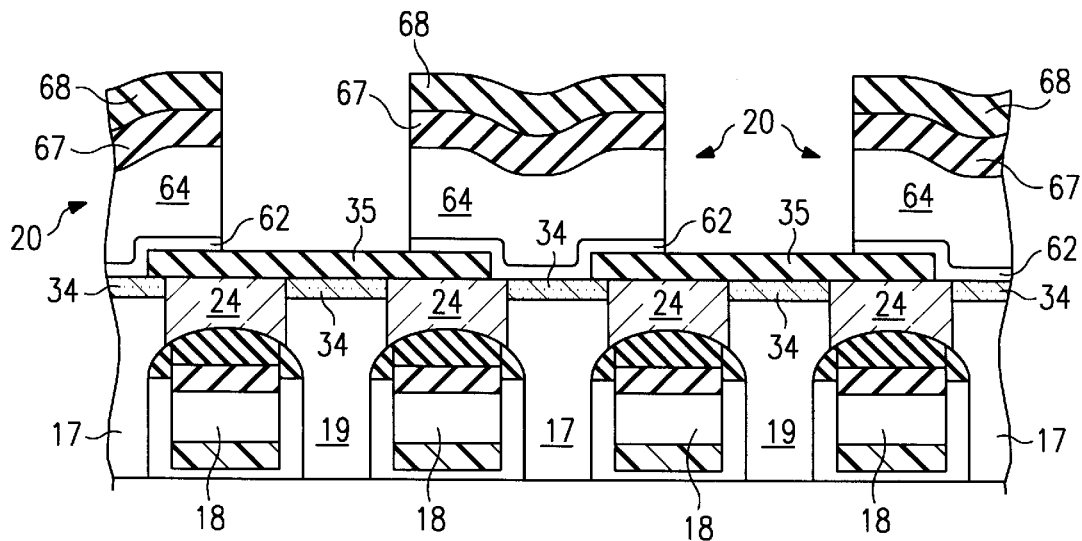
Figure 3G:
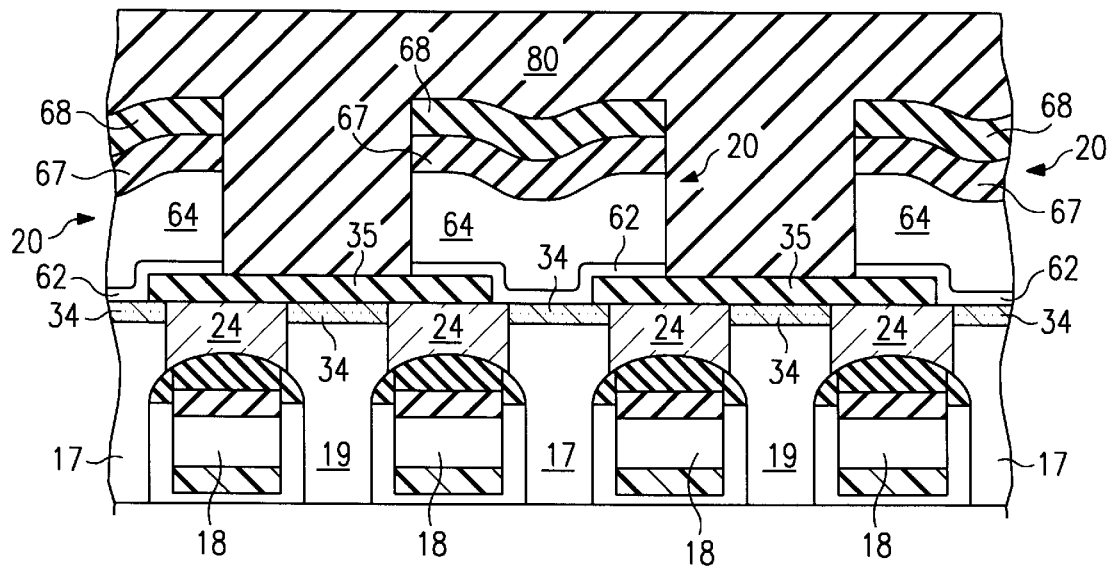
Figure 3H:
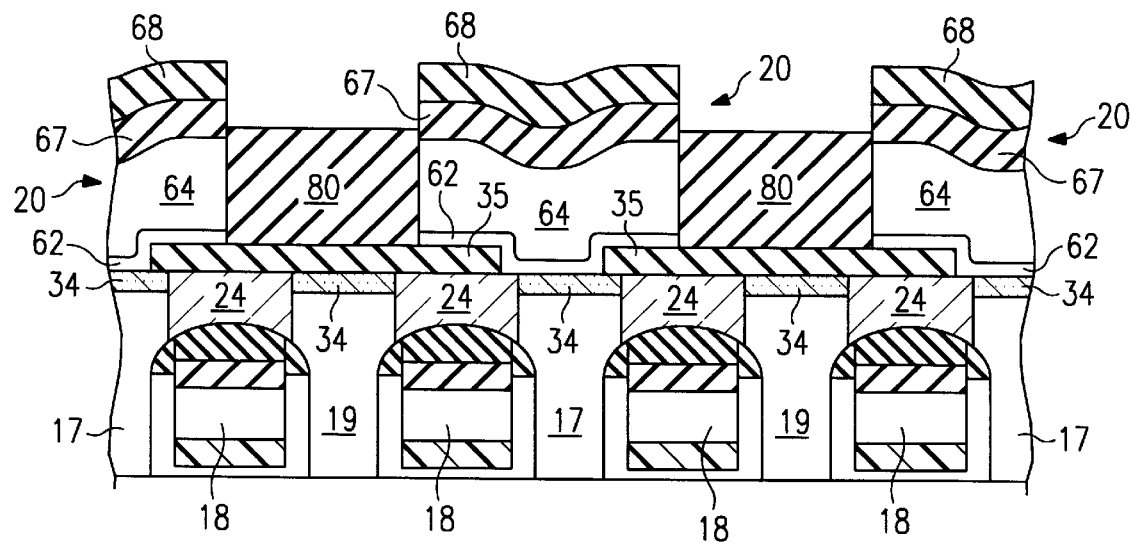

Referring to FIG. 3F, the bitline stack including layers 62, 64, 67, and 68 is patterned and etched to form bitline 20. Then, a planarizing dielectric 80 is formed. Planarizing dielectric 80 planarizes at a local level, as shown in FIG. 3G. For example, planarizing dielectric 80 may comprises a spin-on glass (SOG) silicon dioxide or a deposited silicon dioxide followed by CMP. Alternatively, low dielectric constant dielectrics may alternatively be used. Then, planarizing dielectric 80 is etched-back to below the surface of etchstop layer 68 but above the surface of metal layer 64, as shown in FIG. 3H.

Figure 3I:
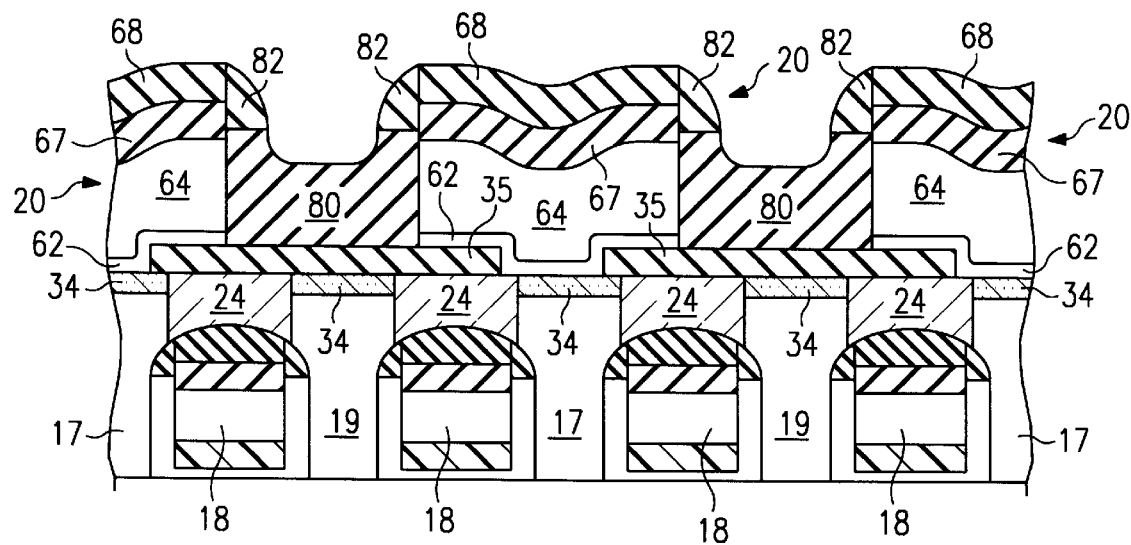

Next, additional etchstop material for layer 68 is conformally deposited and etched back to leave etchstop sidewalls 82 on the sidewalls of the bitline 20 above planarizing dielectric layer 80, as shown in FIG. 3I. If aluminum is used for etchstop layer 68, aluminum-oxide is used for this conformal deposition. Oxidation can be plasma enhanced, water enhanced, or both. For example, boil $H_2O$, followed by a 650° C. $O_2$ for 10 min. or steam oxidation at 650° C. for 10 min.

Figure 3J:
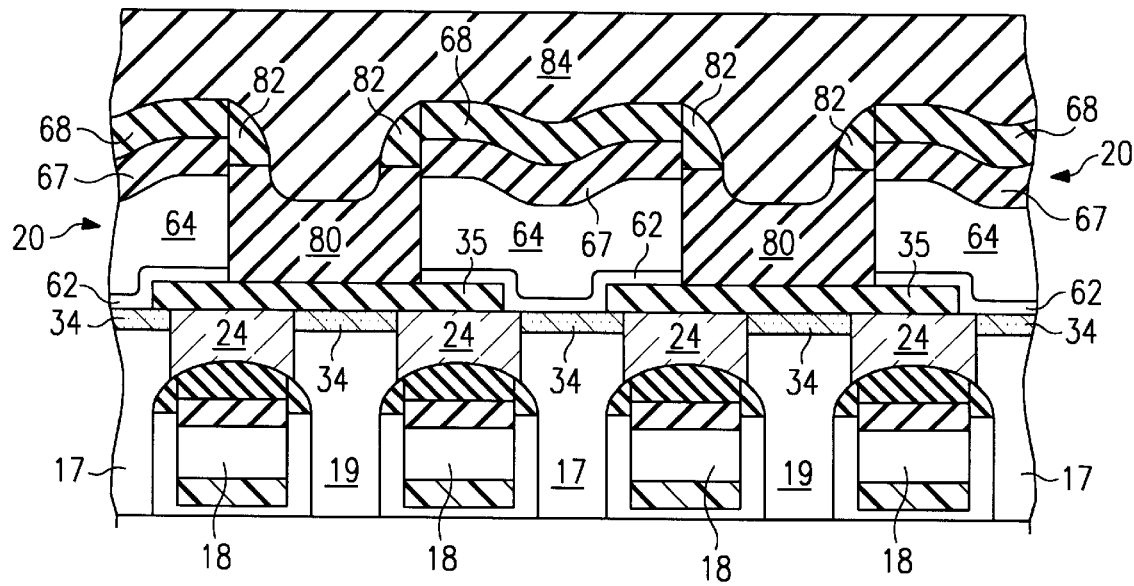

Referring to FIG. 3J, a temporary dielectric 84 is deposited over the structure. A capacitor mask is the used to etch the dielectrics (temporarily dielectric 84, planarizing dielectric 80 and isolation layer 35) down to diffusion barrier 34.

Figure 3K:
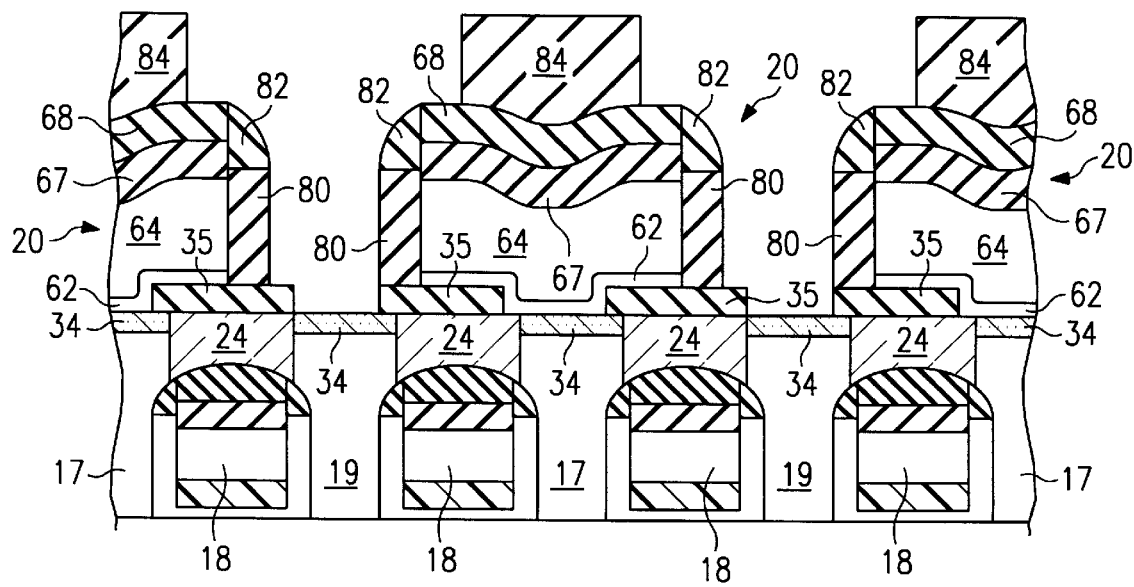

The result is shown in FIG. 3K. No additional masks or etches are required to form a connection to the capacitor via 19, that is, a separate storage node contact is not needed. The etchstop layer 68 and etchstop sidewalls 82 protect the bitline 20. Etchstop sidewalls 82 causes a portion of planarizing dielectric layer 80 to remain on the sidewalls of the bitline 20. The result is silicon dioxide or some low dielectric constant material surrounding the metal layer 64 instead of silicon nitride. This reduces the parasitic capacitance between the capacitor bottom electrode and the bitline. The difficult part of the etch is to not etch through the diffusion barrier 34 or around the diffusion barrier 34 (e.g., exposed portion of interlevel dielectric layer 24). Thus, it may be advantageous to form a nitride layer on the surface of interlevel dielectric layer 24.

Figure 3L:
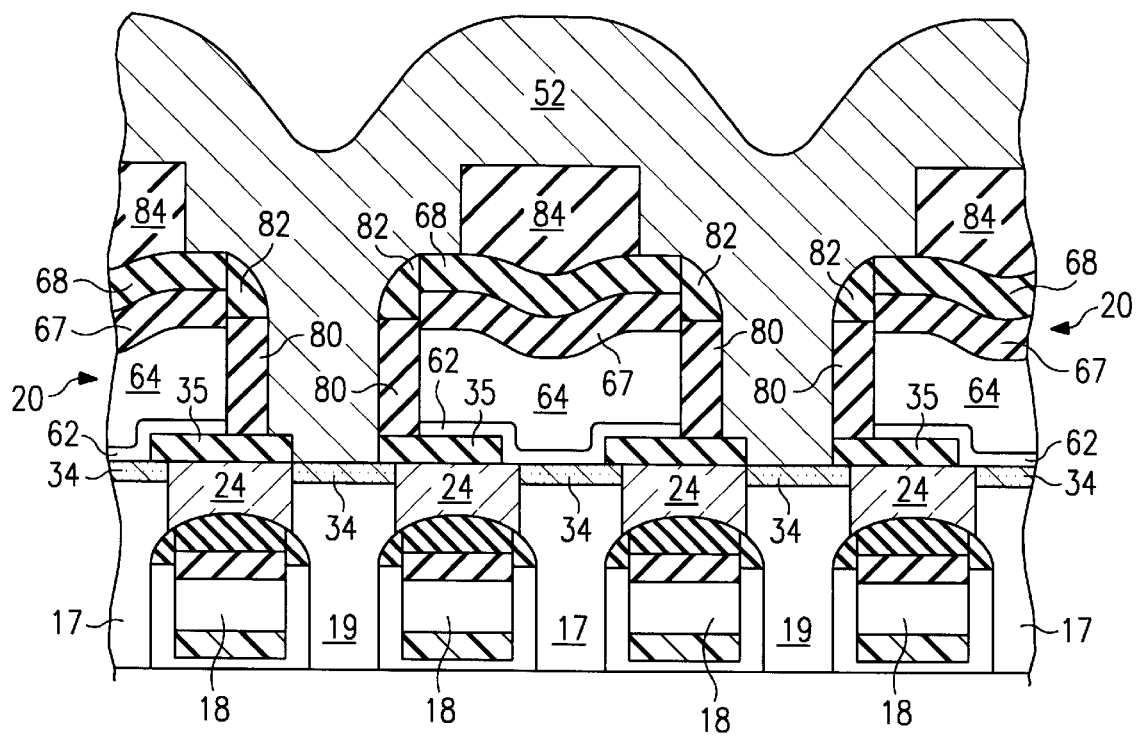

Referring to FIG. 3L, an oxygen stable material 52 is deposited over the structure. Pt is an excellent oxygen stable material for material 52. Other examples for an oxygen stable material 52 include other noble metals (as listed above) and conductive oxides such as $RuO_{2+}$, IrOx, PdO, $(LaSr)CoO_{3+}$ and $SrRuO_3$. A thick oxygen stable material 52 for forming plug structure is shown in FIG. 3D. The oxygen stable material 52 as shown in FIG. 3D may be interpreted as forming both a storage node and a storage node contact. In prior art structures, a storage node contact is required to connect the storage node to the polysilicon plug or via 19. In this process, a single pattern and etch and a single deposition are used to form both the storage node and storage node contact. Alternatively, a thin conformal layer may be deposited to form a pseudo-crown structure as shown in FIG. 4. However, due to the high aspect ratio, depositing a thin conformal layer may be difficult.

Depositing a conformal layer has the advantage of using less material. If, for example, Pt is used as the oxygen stable material 52, the cost of the material is a significant fraction of the cost of the process. In fact, if a thick Pt layer is used, the cost of the material may exceed the cost of performing the process step.

Figure 3M:
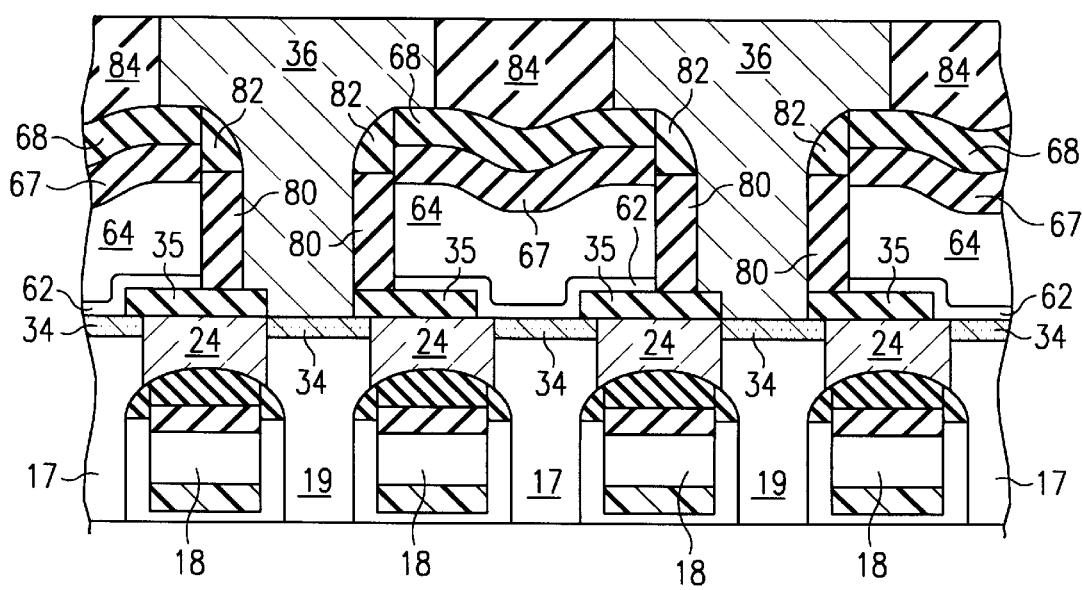

Referring to FIG. 3M, oxygen stable material 52 is then planarized with the surface of temporary layer 84 to form storage node 36. There are two approaches for planarizing the oxygen stable material 52. The first approach is to use chemical-mechanical planarization (CMP). For the case where storage node 36 comprises Pt, CMP may be difficult because Pt is so chemically inert. Chemically etching Pt typically requires hydrochloric acid plus either nitric acid or hydrogen peroxide.

One slightly less corrosive solution that might be easier to use (although less chemically effective) would be a Cl salt like ammonium chloride plus hydrogen peroxide. Alternatively, a soft particle may be used to enhance CMP. Pt is much softer than silicon dioxide and a soft particle will grind Pt faster than it will silicon dioxide.

The second method to planarize the oxygen stable material 52 is by etchback.

If the oxygen stable material 52 has not been deposited so thick as to form a relatively flat surface, a spin-on glass layer may be deposited to perform a local planarization. If material 52 forms a relatively flat surface, then spin-on glass layer is not needed. Next, oxygen stable material 52 is etched back using, for example, a dry etch, resulting in storage node 36. The etch rate of Pt in Ar is much slower that oxide but the etch rate in pure $O_2$ is higher than oxide. Therefore, the $Ar/O_2$ ratio can be adjusted to achieve the same etch rate. Other possible chemistries, such as $Cl_2/O_2$, will be apparent to those of ordinary skill in the art.

Optionally, at this point, it may be advantageous to improve the microstructure or surface morphology of storage node 36 by reflow, grain growth, or both. If the storage node 36 comprises a noble metal, then surface and grain boundary mobility are large enough for reflow and grain growth. There is a driving force to reduce the surface energy or surface area of Pt. This is most easily done by filling the holes. Grain boundaries are disadvantageous because the grain boundaries act as fast diffusion paths for oxygen (present during the subsequent capacitor dielectric formation) from the ambient to the diffusion barrier 34. Since a capacitor structure for a 1 Gbit DRAM is only on the order of 0.18 μm wide and the grain size of Pt can be on the order of 0.3 μm wide, single grain capacitors are possible. Grain growth can be achieved by annealing the structure, thereby resulting in most if not all of the capacitors achieving a single grain per capacitor. Grain boundary motion and surface diffusion are significantly influenced by oxygen with reducing or lack of oxygen resulting in much faster surface diffusion.

Figure 3N:
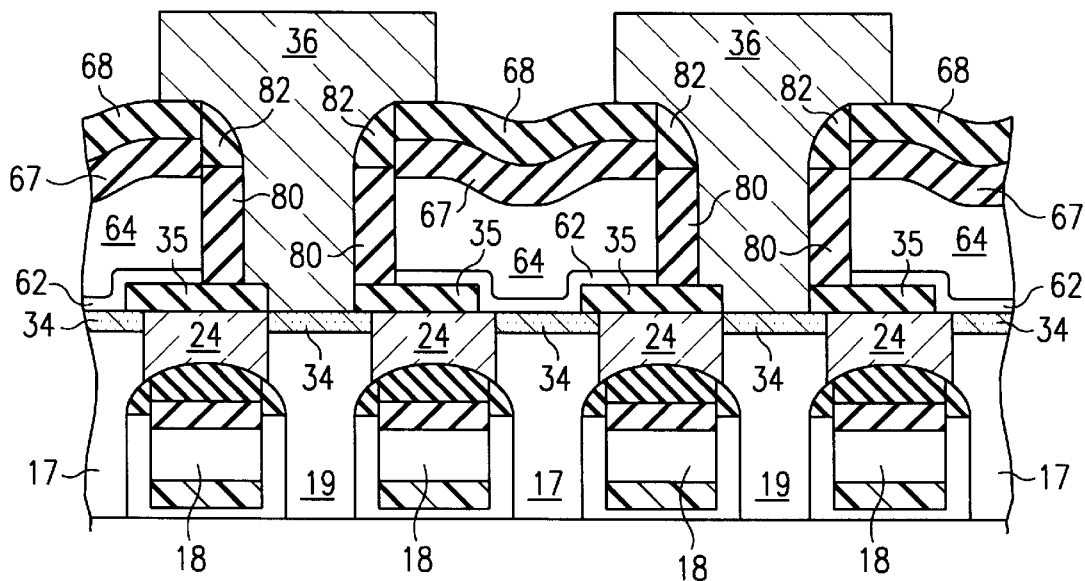

Next, temporary layer 84 (and the remains of the SOG layer if present) are removed using storage node 36 as a mask, as shown in FIG. 3N. For example, a wet, selective dry or vapor dielectric etch may be used. The remaining storage node 36 can have 90° sidewalls. The top of the storage node 36 may not be planar. However, the majority of the storage area comes from the storage node 36 sidewalls.

The invention has several benefits. One benefit is that the oxygen stable storage node 36 is defined by etching the easily etchable material of the temporary dielectric 84 (e.g. PSG) and not by fine pattern etching the oxygen stable material 52. With the exception of Ru, most of the oxygen stable bottom electrode materials are very hard to dry etch fine patterns. The principle problem is the difficulty in forming volatile halides or oxides. For example, etching Pt in fluorine and chlorine gas mixtures is almost a completely physical process until very high temperatures (>300° C.) are reached. Physical etching typically results in redeposition on the sidewalls of photoresist or other pattern definers unless a very sloped sidewall (<65 degrees) is used. If the goal is to etch 1 G-like structures (F-0.18 μm) with reasonable aspect ratios (>1), then sloped sidewalls are a serious problem.

Figure 3O:
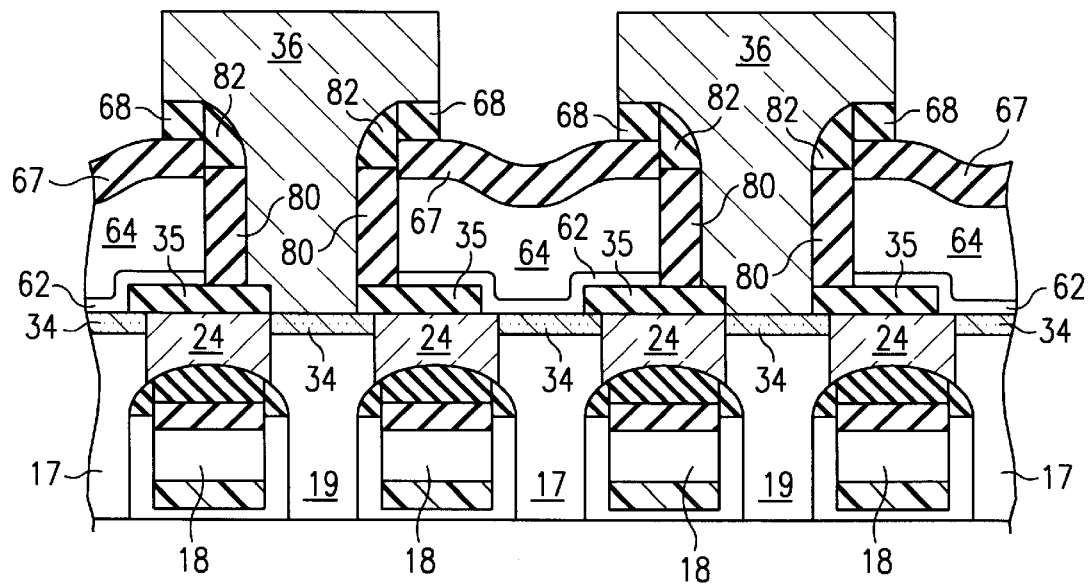

The structure of FIG. 3N can have a relatively large capacitor to capacitor parasitic capacitance after the capacitor dielectric formation described below. Therefore, the etchstop layer 68 may be optionally etched at this point using storage node 36 as a hardmask. This is shown in FIG. 3O. Etching away etchstop layer 68 significantly reduces the parasitic capacitance by eliminating the higher K silicon nitride path between on capacitor 12 and the next.

Figure 3P:
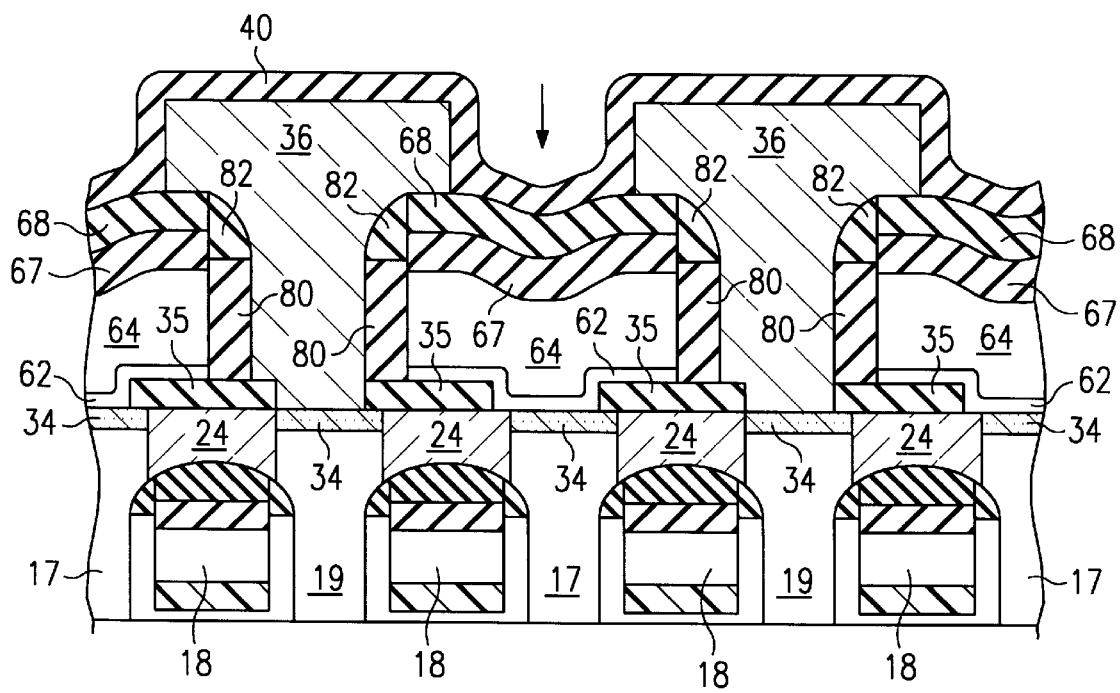
Figure 3Q:
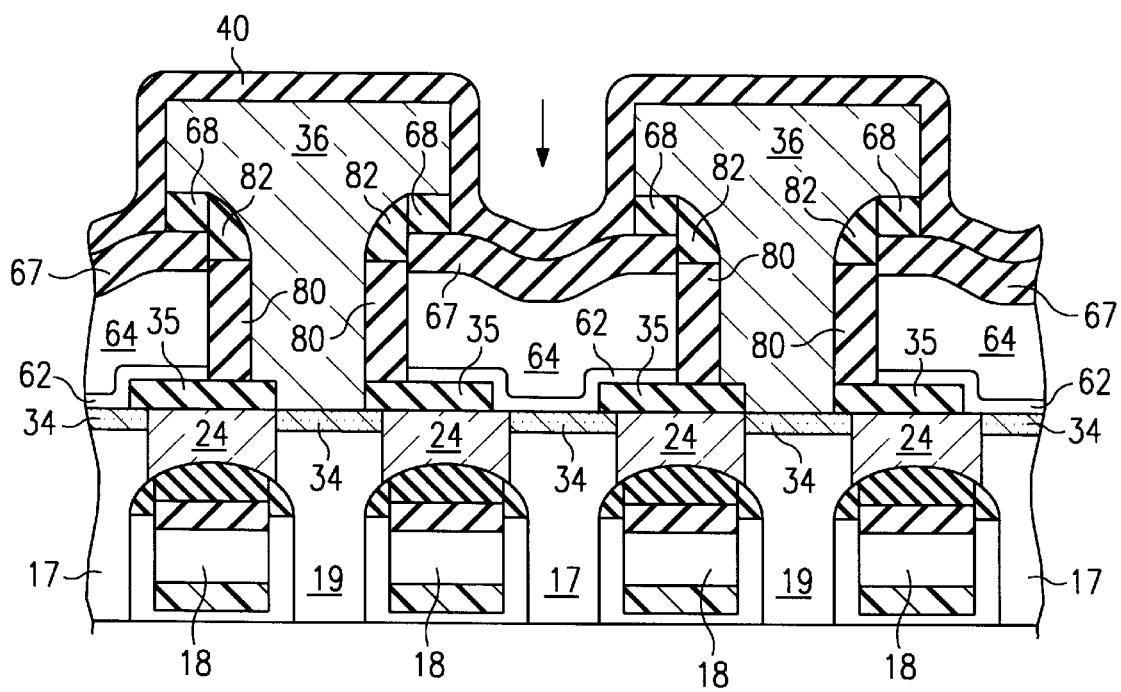

The structure of FIGS. 3N or 3O is the storage node 36 upon which the HDC capacitor dielectric 40 is deposited (see FIGS. 3P and 3Q, respectively). The preferred HDC dielectric is BST. However, other HDC dielectric could alternatively be used. Finally, the top capacitor electrode 44 is formed over HDC dielectric 40 (see, FIG. 2). Exemplary top electrode materials for use over a HDC dielectric are known in the art. The top electrode 44 will, in general, comprises the same material(s) as the bottom electrode in order to have symmetrical leakage currents. The material in contact with the capacitor dielectric 40 can be relatively thin if it is covered by a conductive diffusion barrier or other metallization layer. A specific embodiment might comprises a 50 nm thick Pt or Ir layer. The deposition is either sputter deposited (long throw, collimated, or ionized for better conformality) or CVD. Next, a 50–100 nm thick layer of TiN or TiAlN is deposited by reactive sputter deposition or by CVD. The top electrode 44 is then pattern by reactive ion etch process and TiN or TIAlN can be used as a hardmask for the remaining etch if desired. The sample might be annealed in N2 is TiN is used of $O_2$ is TiAlN is used as a hardmask. Typical anneal conditions are 650° C. in $N_2$ or $O_2$ for 30 sec for 550° C. in $N_2$ or $O_2$ for 30 min.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for forming a high dielectric constant (HDC) capacitor comprising the steps of:

forming a temporary dielectric layer over a structure on which the capacitor is desired;

forming a pattern over the temporary dielectric layer, said pattern exposing portions of the temporary dielectric layer for a storage node area;

etching said temporary dielectric layer using said pattern to remove said dielectric layer in said storage node area;

removing said pattern;

depositing an oxygen stable material over said temporary dielectric layer and in said storage node area;

removing said oxygen stable material from over said dielectric layer, leaving said oxygen stable material in said storage node area and exposing a portion of said temporary dielectric layer;

removing said exposed portion of said temporary dielectric layer;

forming a HDC dielectric over the oxygen stable material; and forming an upper electrode over the HDC dielectric.

2. The method of claim 1, wherein the step of removing the oxygen stable material comprises the steps of:

reactive ion etching said oxygen stable material to etch-back said oxygen stable material to a level at or below a surface of said temporary dielectric layer.

3. The method of claim 1, wherein the step of removing the oxygen stable material comprises the steps of:

chemically-mechanically polishing said oxygen stable material until oxygen stable material is at a level at or below a surface of said temporary dielectric layer.

4. The method of claim 1, wherein the oxygen stable layer comprises a material selected from the group consisting of noble metals, alloys of noble metals, and conductive oxides.

5. The method of claim 1, wherein said HDC dielectric comprises a material selected from the group consisting of BST, other perovskites, ferroelectrics, pyroelectrics, or high dielectric constant oxides.

6. The method of claim 1, wherein said temporary dielectric comprises silicon dioxide.

7. The method of claim 1, further comprising the step of forming a diffusion barrier layer below said storage node area prior to forming said oxygen stable layer.

8. The method of claim 7, wherein the step of forming said diffusion barrier comprises the steps of:

forming a silicide;

converting the surface of the silicide to a nitride diffusion barrier by subjecting it to an elevated temperature nitrogen plasma with a relatively large substrate bias.

9. The method of claim 1, wherein said steps of depositing an oxygen stable material and removing said oxygen stable material from over said dielectric layer form both a storage node contact and a storage node.

10. A method for forming a DRAM comprising the steps of:

providing a semiconductor body processed through inter-level dielectric formation, including the formation of isolation structures, wordlines, capacitor vias and bit-line vias;

forming a diffusion barrier layer over said capacitor vias and bitline vias;

forming an isolation layer over said diffusion barrier and said interlevel dielectric;

patterning and etching said isolation layer to expose a first portion of said diffusion barrier over said bitline vias;

forming a bitline structure connected to said first portion of said diffusion barrier;

depositing a planarizing dielectric layer;

recessing said planarizing dielectric layer below a height of said bitline structure;

forming a sidewall dielectric above said planarizing dielectric layer, said sidewall dielectric forming a hard-mask;

forming a temporary dielectric layer over said bitline structure, sidewall dielectric and planaiizing dielectric;

forming a pattern over said temporary dielectric layer, said pattern exposing an storage node area;

etching said temporary dielectric layer using said pattern as a mask and etching said planarizing dielectric and isolation layer using said pattern and said sidewall dielectric as masks, wherein said sidewall dielectric causes a portion of said planarizing dielectric to remain on sidewalls of said bitline structure;

removing said pattern;

depositing an oxygen stable material over said temporary dielectric and in said storage node area;

removing said oxygen stable material until said temporaly dielectric is exposed;

removing said temporary dielectric layer;

forming a HDC dielectric over the oxygen stable layer; and forming an upper electrode over the HDC dielectric.

11. The method of claim 10, wherein the step of forming said bitline structure comprises the steps of:

depositing an adhesion layer;

depositing a metal layer over said adhesion layer;

depositing a silicon dioxide layer over said metal layer;

depositing an etchstop layer over said silicon dioxide layer; and patterning and etching said etchstop layer, silicon dioxide layer, metal layer, and adhesion layer.

12. The method of claim 11, wherein said etchstop layer comprises silicon nitride.

13. The method of claim 11, wherein said etchstop layer comprises aluminum-oxide.

14. The method of claim 11, wherein said step of recessing said planarizing dielectric recesses said planarizing dielectric to below a surface of said etchstop layer and above a surface of said metal layer.

15. The method of claim 10, wherein the step of removing the oxygen stable layer comprises the step of reactively ion etching said oxygen stable layer.

16. The method of claim 10, wherein the step of removing the oxygen stable layer comprises the step of chemically-mechanically etching said oxygen stable layer.

17. The method of claim 10, wherein the step of forming said diffusion barrier comprises the steps of:

forming a silicide over said bitline vias and capacitor vias;

converting the surface of the silicide to a nitride diffusion barrier by subjecting it to an elevated temperature nitrogen plasma with a relatively large substrate bias.

18. The method of claim 10, wherein the oxygen stable layer comprises a material selected from the group consisting of noble metals, alloys of noble metals, and conductive oxides.

19. The method of claim 10, wherein said HDC dielectric comprises a material selected from the group consisting of BST, other perovskites, ferroelectrics, pyroelectrics, or high dielectric constant oxides.

20. The method of claim 10, wherein said pattern exposes portions of said temporary dielectric layer wider than said storage node contact.

21. The method of claim 11, further comprising the step of removing a portion of said etchstop layer to reduce capacitance.

\* \* \* \* \*